US010332916B2

(12) United States Patent
Lee et al.

(10) Patent No.: US 10,332,916 B2
(45) Date of Patent: Jun. 25, 2019

(54) METAL LINE AND THIN FILM TRANSISTOR

(71) Applicant: SAMSUNG DISPLAY CO., LTD., Yongin-si, Gyeonggi-do (KR)

(72) Inventors: Dong Min Lee, Anyang-si (KR); Sang Won Shin, Yongin-si (KR); Hyun Eok Shin, Gwacheon-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 16/013,410

(22) Filed: Jun. 20, 2018

(65) Prior Publication Data

US 2019/0115369 A1   Apr. 18, 2019

(30) Foreign Application Priority Data

Oct. 17, 2017   (KR) .......................... 10-2017-0134845

(51) Int. Cl.
| | | |
|---|---|---|
| H01L 21/44 | (2006.01) | |
| H01L 27/12 | (2006.01) | |
| H01L 23/528 | (2006.01) | |
| H01L 23/532 | (2006.01) | |
| H01L 21/768 | (2006.01) | |
| H01L 21/285 | (2006.01) | |
| H01L 29/49 | (2006.01) | |
| H01L 29/786 | (2006.01) | |

(52) U.S. Cl.
CPC ........ *H01L 27/124* (2013.01); *H01L 21/2855* (2013.01); *H01L 21/7685* (2013.01); *H01L 23/528* (2013.01); *H01L 23/53219* (2013.01); *H01L 23/53223* (2013.01); *H01L 23/53257* (2013.01); *H01L 27/1262* (2013.01); *H01L 29/4908* (2013.01); *H01L 27/1222* (2013.01); *H01L 29/78675* (2013.01)

(58) Field of Classification Search
CPC .................................................. H01L 21/76832
See application file for complete search history.

(56) References Cited

U.S. PATENT DOCUMENTS

| | | | | |
|---|---|---|---|---|
| 6,040,613 A * | 3/2000 | McTeer | ..................... | H01J 1/52 257/437 |
| 7,648,899 B1 * | 1/2010 | Banerji | ............... | C23C 16/0227 257/E21.575 |
| 7,858,510 B1 * | 12/2010 | Banerji | ............... | C23C 16/0227 257/E21.269 |
| 8,492,858 B2 * | 7/2013 | Li | .......................... | H01L 43/08 257/421 |
| 9,598,772 B2 * | 3/2017 | Lin | ..................... | C23C 18/1605 |
| 9,673,272 B2 | 6/2017 | Choi et al. | | |
| 2002/0096775 A1 * | 7/2002 | Ning | ................... | H01L 21/7684 257/763 |

(Continued)

FOREIGN PATENT DOCUMENTS

| | | |
|---|---|---|
| JP | 2009-200355 A | 9/2009 |
| KR | 10-2006-0118202 A | 11/2006 |

*Primary Examiner* — Thao P Le
(74) *Attorney, Agent, or Firm* — Lee & Morse, P.C.

(57) ABSTRACT

A metal line includes a conductive layer containing aluminum (Al) or an aluminum alloy, a first capping layer on the conductive layer, the first capping layer containing titanium nitride ($TiN_x$), and a second capping layer on the first capping layer, the second capping layer containing titanium (Ti).

20 Claims, 6 Drawing Sheets

(56) References Cited

U.S. PATENT DOCUMENTS

| | | | | |
|---|---|---|---|---|
| 2006/0099824 A1* | 5/2006 | Liu | ................... | H01L 21/02112 |
| | | | | 438/758 |
| 2011/0162874 A1* | 7/2011 | Nguyen | ............ | H01L 21/76846 |
| | | | | 174/257 |
| 2011/0254151 A1* | 10/2011 | Lin | ..................... | C23C 18/1605 |
| | | | | 257/737 |
| 2011/0266667 A1* | 11/2011 | Wu | ................... | H01L 23/49811 |
| | | | | 257/737 |
| 2012/0273945 A1* | 11/2012 | Chang | ..................... | H01L 24/11 |
| | | | | 257/737 |
| 2012/0280388 A1* | 11/2012 | Wu | ................... | H01L 23/49811 |
| | | | | 257/737 |

* cited by examiner

METAL LINE AND THIN FILM TRANSISTOR

CROSS-REFERENCE TO RELATED APPLICATION

Korean Patent Application No. 10-2017-0134845, filed on Oct. 17, 2017, in the Korean Intellectual Property Office, and entitled: "Metal Line and Thin Film Transistor," is incorporated by reference herein in its entirety.

BACKGROUND

1. Field

Embodiments relate to a metal line and a thin film transistor including the same.

2. Description of the Related Art

A display device such as an organic light-emitting display device or a liquid crystal display device includes a thin film transistor (TFT) as a driving and control element for image output. The thin film transistor may include a metal line such as a gate line or a data line for transmitting electrical signals.

SUMMARY

Embodiments are directed to a metal line including a conductive layer containing aluminum (Al) or an aluminum alloy, a first capping layer on the conductive layer, the first capping layer containing titanium nitride ($TiN_x$), and a second capping layer on the first capping layer, the second capping layer containing titanium (Ti).

The conductive layer may include an aluminum alloy that contains at least one of nickel (Ni), lanthanum (La), neodymium (Nd), and germanium (Ge).

An atomic ratio of nitrogen and titanium contained in the first capping layer, the atomic ratio being expressed by the formula: number of nitrogen atoms/number of titanium atoms, is 0.9 to 1.2.

The conductive layer and the first capping layer may contact each other.

The first capping layer and the second capping layer may contact each other.

A content of nitrogen atoms in a portion of the first capping layer closer to the conductive layer may be higher than a content of nitrogen atoms in the first capping layer closer to the second capping layer.

The metal line may further include a third capping layer on the second capping layer, the third capping layer containing titanium nitride.

A content of nitrogen atoms in a portion of the third capping layer toward the second capping layer is lower than a content of nitrogen atoms in a portion of the third capping layer closer to a side opposite to the second capping layer.

A content of nitrogen atoms in the first capping layer may be different from a content of nitrogen atoms in the third capping layer.

Embodiments are also directed to a thin film transistor including a gate metal layer and a data metal layer electrically isolated from each other by an insulation film. The gate metal layer and/or the data metal layer includes a conductive layer containing aluminum (Al) or an aluminum alloy, a first capping layer on the conductive layer, the first capping layer containing titanium nitride ($TiN_x$), and a second capping layer on the first capping layer, the second capping layer containing titanium (Ti).

An atomic ratio of nitrogen and titanium contained in the first capping layer, the atomic ratio being expressed by the formula: number of nitrogen atoms/number of titanium atoms, may be 0.9 to 1.2.

The gate metal layer and/or the data metal layer may further include a third capping layer on the second capping layer, the third capping layer containing titanium nitride.

A content of nitrogen atoms in the first capping layer may be different from a content of nitrogen atoms in the third capping layer.

Embodiments are also directed to a method of manufacturing a metal line including forming a titanium nitride ($TiN_x$) film on an aluminum (Al) film or an aluminum alloy film and forming a titanium (Ti) film on the titanium nitride film.

An atomic ratio of nitrogen and titanium contained in the titanium nitride film, the atomic ratio being expressed by the formula: number of nitrogen atoms/number of titanium atoms, may be 0.9 to 1.2.

The titanium nitride film may be formed through sputtering using titanium and nitrogen ($N_2$).

The titanium film may be formed through continuous sputtering in which only a supply of nitrogen stops while forming the titanium nitride film.

Inert gas may be additionally supplied during the sputtering. An amount of supply of nitrogen may be larger than an amount of supply of the inert gas during the sputtering.

The method may further include forming a sub-titanium nitride film on the titanium film.

The titanium film may be formed through sputtering. The sub-titanium nitride film may be formed through continuous sputtering in which nitrogen is additionally supplied while forming the titanium film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
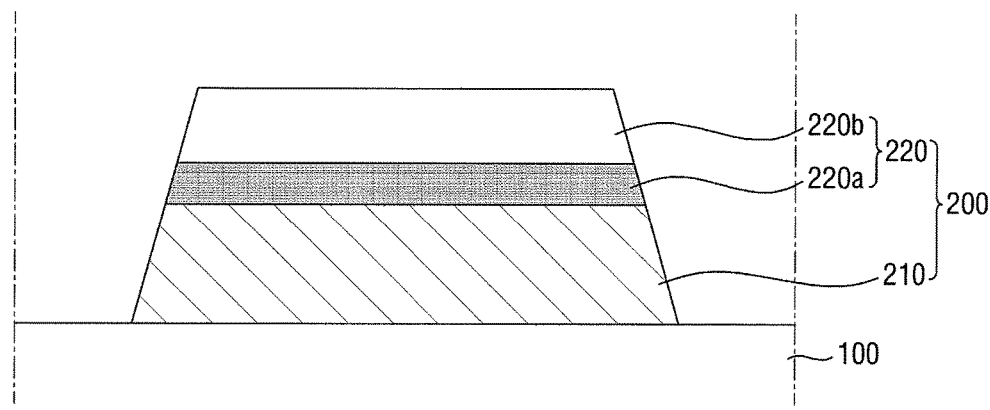
FIG. 1 illustrates a sectional view of a metal line according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 illustrates a sectional view of a metal line 200 according to an embodiment.

Referring to FIG. 1, the metal line 200 may be disposed on a base member 100 and may include a conductive layer 210 and a capping layer 220.

The base member 100 may support the metal line 200 by providing a space on which the metal line 200 can be disposed. The upper surface of the base member 100 may be a base surface contacting the metal line 200. The term "base member" may refer to any member capable of supporting the metal line 200. The metal line 200 may be directly disposed on the base member 100, as an example. Another member supported by the base member 100 may also be disposed between the metal line 200 and the base member 100.

In an exemplary embodiment, the metal line 200 may be a gate line or data line constituting a thin film transistor. In this case, the base member 100 may be a glass substrate or a polymer substrate that is a base substrate of the thin film transistor. In some implementations, the base member may be a buffer layer or insulation layer directly supporting the metal line 200.

The metal line 200 may have a multi-layer structure including the conductive layer 210 and the capping layer 220. The conductive layer 210 may be a layer disposed on the upper side of the base member 100.

The conductive layer 210, which is a layer imparting electrical conductivity to the metal line 200, may contain aluminum (Al) or an aluminum alloy. The aluminum alloy may contain at least one of nickel (Ni), lanthanum (La), neodymium (Nd) and germanium (Ge) as an additive material together with aluminum (Al) as a base material. The additive material such as nickel (Ni) may be contained in an amount of, for example, 2 at % or less.

Aluminum is a relatively low resistance material having a surface resistance of about $0.15\Omega/\square$ (based on thickness of 3 kÅ) compared to molybdenum (Mo) having a surface resistance of about $0.55\Omega/\square$ (based on thickness of 2.5 kÅ). Accordingly, the conductive layer 210 containing aluminum or an aluminum alloy may have sufficient electrical conductivity.

The capping layer 220 may be disposed on the conductive layer 210. The capping layer 220 may have a multi-layer structure, and may include a first capping layer 220a disposed on the conductive layer 210 and a second capping layer 220b disposed on the first capping layer 220a.

The first capping layer 220a may be disposed directly on the conductive layer 210 to contact the conductive layer 210, and may substantially cover the upper surface of the conductive layer 210. The first capping layer 220a may contain titanium nitride ($TiN_x$).

As described above, the conductive layer 210 may be made of a material including aluminum. However, if the conductive layer 210 were to be formed of only aluminum, a hillock could occur due to a high-temperature (400 to 580° C.) process such as a process to activate a semiconductor layer of a thin film transistor or due to a subsequent process of generating plasma such as a process to form a contact hole, thereby causing the resistance of the conductive layer 210 to increase.

If the upper surface of the conductive layer 210 were to be capped with titanium (Ti), the occurrence of a hillock could be prevented. However, in this case, diffusion could occur at the interface between aluminum and titanium during a subsequent high-temperature process, such that an aluminum-titanium alloy is formed, thereby increasing the resistance of the conductive layer 210. Further, in this case, damage to aluminum and titanium could occur due to hydrofluoric acid (HF) used as a cleaning liquid during a cleaning process, such as buffer oxide etching (BOE) process.

Therefore, the conductive layer may be capped with titanium nitride constituting the first capping layer 220a, so as to prevent the occurrence of a hillock of the conductive layer 210 and to prevent the occurrence of damage to the conductive layer 210 and the capping layer 220. Further, it may be possible to prevent the occurrence of a diffusion phenomenon between aluminum and titanium, such that an aluminum-titanium alloy such as $Al_3Ti$ is not be formed at the interface between the conductive layer 210 and the first capping layer 220a, or is formed only in a trace amount.

The thickness of the first capping layer 220a may be about 50 Å to about 400 Å. When the thickness of the first capping layer 220a is 50 Å or more, it may be possible to suppress the damage caused by a subsequent BOE process and prevent an increase in resistance due to aluminum-titanium diffusion. Further, when the thickness of the first capping layer 220a is 400 Å or less, inefficiency in the thin film process may be avoided.

The atomic ratio of nitrogen (N) to titanium (Ti) contained in the first capping layer 220a (the number of nitrogen atoms/the number of titanium atoms) may be about 0.9 to about 1.2. When the atomic ratio of nitrogen (N) to titanium (Ti) is 0.9 or more, the formation of an aluminum-titanium alloy may be effectively prevented. Further, when the atomic ratio thereof is 1.2 or less, the generation of particles in the first capping layer 220a, such as is described below, can be suppressed.

The ratio of nitrogen atoms contained in the first capping layer 220a may be substantially uniform regardless of the position in the first capping layer 220a. In some implementations, the nitrogen atoms may have different distributions depending on the position in the thickness direction of the first capping layer 220a.

The second capping layer 220b may be disposed directly on the first capping layer 220a to contact the first capping layer 220a. The second capping layer 220b may be disposed to substantially cover the upper surface of the first capping layer 220a. The second capping layer 220b may contain titanium.

As described above, when the first capping layer 220a is made of titanium nitride, it is possible to prevent the occurrence of diffusion or damage between aluminum and titanium. However, as the ratio of nitrogen increases during the process of forming titanium nitride, particles could be generated in a larger amount, thereby causing a detrimental results. The degree of particle generation may be be stabilized by forming the second capping layer 220b made of titanium on the first capping layer 220a.

The first capping layer 220a and the second capping layer 220b may be formed by sputtering. For example, the first capping layer 220a and the second capping layer 220b may be formed by continuous sputtering in which the second capping layer 220b is continuously formed on the first capping layer 220a.

Figure 2:
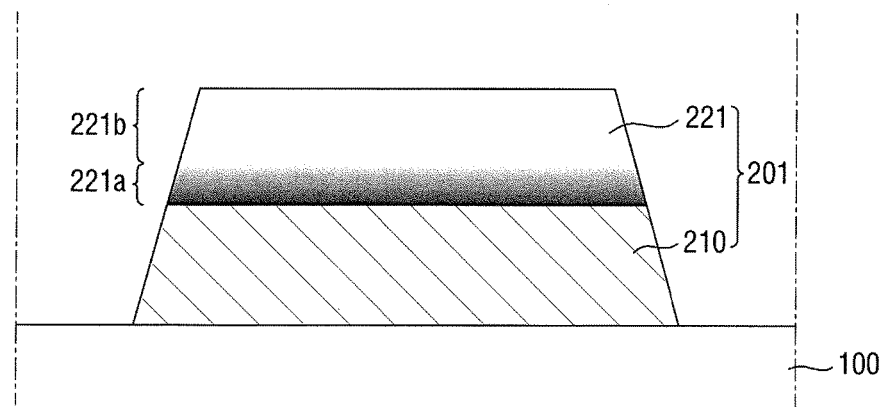
FIGS. 2 to 4 illustrate sectional views of metal lines according to other embodiments.

FIG. 2 illustrates a sectional view of a metal line 201 according to another embodiment.

The metal line 201 of FIG. 2 is the same as the metal line 200 having been described with reference to FIG. 1, except that the ratio of nitrogen atoms contained in the capping layer 221 gradually changes in a thickness direction. Hereinafter, redundant descriptions will not be repeated.

Referring to FIG. 2, the capping layer 221 may contain titanium nitride and titanium, and the ratio of nitrogen atoms in the capping layer 221 may gradually decrease in an upward direction, for example, in a direction away from the conductive layer 210. Accordingly, the capping layer 221 may be divided into the first capping layer 221a containing titanium nitride and the second capping layer 221b containing only titanium with no nitrogen atom. Further, the ratio of nitrogen atoms contained in titanium nitride in the first capping layer 221a may gradually decrease toward the second capping layer 221b.

For example, the capping layer 221 may be an integrated layer in which titanium nitride and titanium continuously exist. Such a capping layer 221 may be formed, for example, by continuous sputtering in which the supply of nitrogen gradually decreases.

Figure 3:
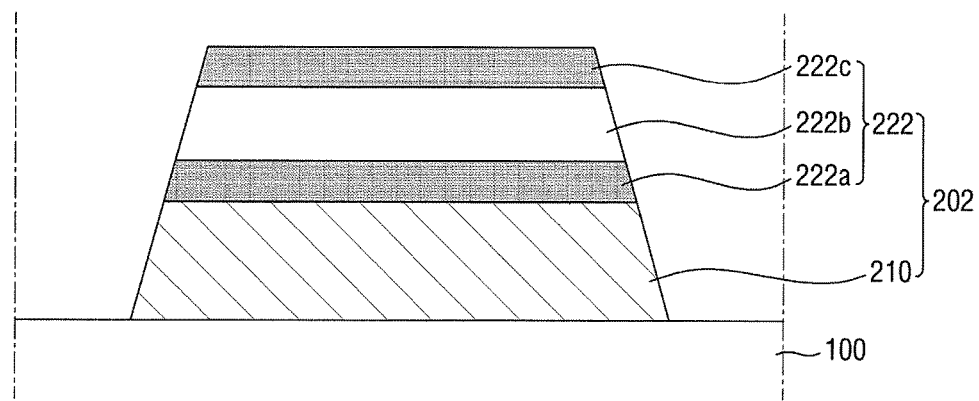

FIG. 3 illustrates a sectional view of a metal line 202 according to another embodiment.

The metal line 202 of FIG. 3 may be the same as the metal line 200 described with reference to FIG. 1, except that the metal line 202 of FIG. 3 further includes a third capping layer 222c disposed on a second capping layer 222b. Hereinafter, redundant descriptions will not be repeated.

Referring to FIG. 3, the third capping layer 222c may be disposed directly on the second capping layer 222b to contact the second capping layer 222b. The third capping layer 222c may be disposed to substantially cover the upper surface of the second capping layer 222b. The third capping layer 222c may contain titanium nitride.

As described above, there is a risk that titanium could be damaged by a cleaning liquid or the like in a subsequent process. The second capping layer 222b, containing titanium may be protected by additionally providing the third capping layer 222c containing titanium nitride on the second capping layer 222b.

The ratio of nitrogen atoms in the first capping layer 222a and the ratio of nitrogen atoms in the third capping layer 222c may be the same as or different from each other. In an exemplary embodiment, if the first capping layer 222a is provided thereon with the second capping layer 222b capable of stabilizing the formation of particles, the first capping layer 222a may be formed such that the ratio of nitrogen in titanium nitride is high. In contrast, if the third capping layer 222c is not provided thereon with a separate titanium layer, the third capping layer 222c may be formed such that the ratio of nitrogen in titanium nitride is low.

The thickness of the third capping layer 222c may be about 50 Å to about 400 Å. When the thickness of the third capping layer 222c is within the above range, the damage due to a subsequent BOE process may be effectively suppressed.

Figure 4:
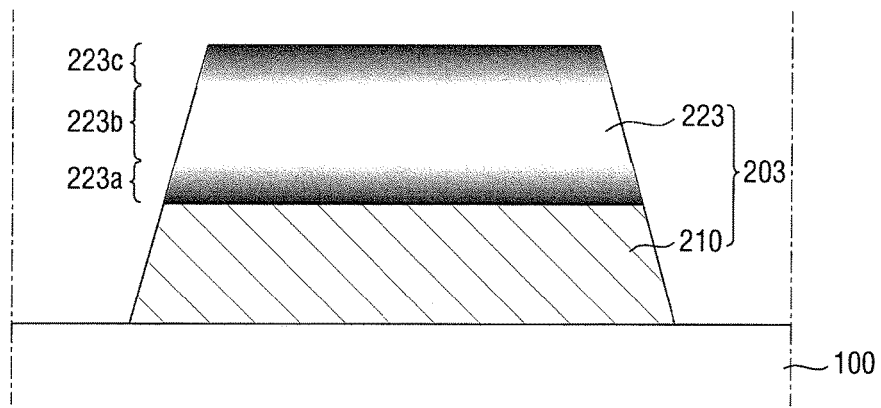

FIG. 4 illustrates a sectional view of a metal line 203 according to another embodiment.

The metal line 203 of FIG. 4 may be the same as the metal line 202 described with reference to FIG. 3, except that the ratio of nitrogen atoms contained in the capping layer 223 gradually changes in a thickness direction. Hereinafter, redundant descriptions will not be repeated.

Referring to FIG. 4, the capping layer 223, similarly to the embodiment of FIG. 2, may contain titanium nitride and titanium, and the ratio of nitrogen atoms in the capping layer 223 may gradually decrease in an upward direction, for example, in a direction away from the conductive layer 210, and then increase again. Therefore, the capping layer 223 may be considered as being divided into the first capping layer 223a containing titanium nitride, the second capping layer 223b containing only titanium with no nitrogen atom, and the third capping layer 223c containing titanium nitride. The ratio of nitrogen atoms contained in titanium nitride in the first capping layer 223a may gradually decrease in a direction toward the second capping layer 223b, and the ratio of nitrogen atoms contained in titanium nitride in the third capping layer 223c may gradually increase in a direction away from the second capping layer 223b.

For example, the capping layer 223 of FIG. 4 may be an integrated layer in which titanium nitride and titanium exist in a continuum. Such a capping layer 223 may be formed by continuous sputtering in which the supply of nitrogen gradually decreases and then increases.

Figure 5:
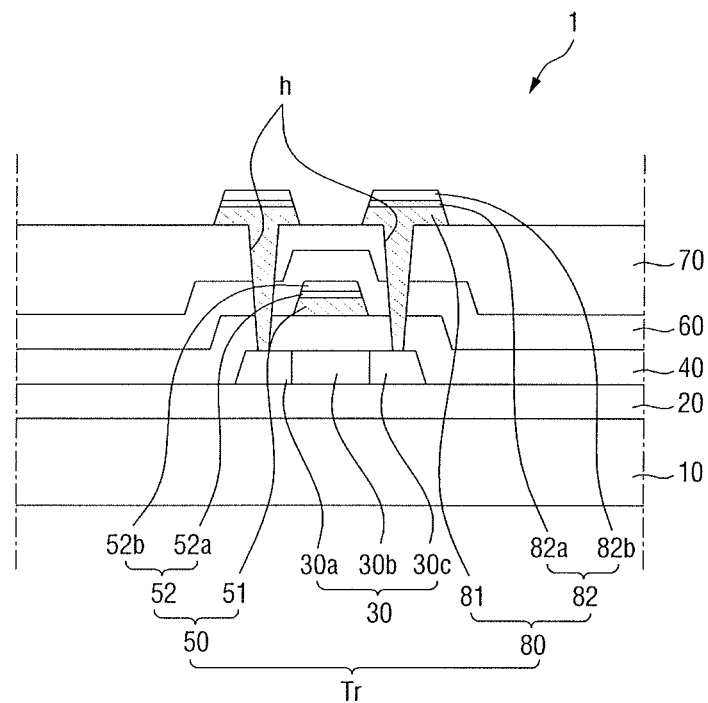
FIG. 5 illustrates a sectional view of a thin film transistor substrate according to an embodiment.

FIG. 5 illustrates a sectional view of a thin film transistor substrate 1 according to an embodiment.

Referring to FIG. 5, the thin film transistor substrate 1 may include a base substrate 10, a buffer layer 20, a semiconductor layer 30, a first insulation layer 40, a gate metal layer 50, a second insulation layer 60, a planarization layer 70, and a data metal layer 80.

The base substrate 10 may provide a space on which elements constituting the thin film transistor substrate 1 are disposed. The base substrate 10 may be, for example, a glass substrate or a polymer substrate having flexibility.

The buffer layer 20 may be disposed on the base substrate 10. The buffer layer 20 may contain silicon nitride ($SiN_x$), silicon oxide ($SiO_x$), silicon oxynitride ($SiO_xN_y$), or the like, and may be formed as a single layer or a multilayer. The buffer layer 20 may prevent the penetration of impurities, moisture, or external air that could degrade the characteristics of a semiconductor, and may provide surface planarization.

The semiconductor layer 30 may be disposed on the buffer layer 20. The semiconductor layer 30 may include a channel region 30b and a source region 30a and drain region 30c located at both lateral sides of the channel region 30b. The channel region 30b may contain an intrinsic semiconductor, for example, a polycrystalline silicon not doped with impurities. Each of the source region 30a and the drain region 30c may contain an impurity semiconductor, for example, a polycrystalline silicon doped with impurities.

The first insulation layer 40 may be disposed on the semiconductor layer 30. The first insulation layer 40 may include silicon nitride, silicon oxide, silicon oxynitride, or the like. The first insulation layer 40 may be formed as a single layer or a multilayer.

The gate metal layer 50 may be disposed on the first insulation layer 40. The gate metal layer 50 may include a gate line, a gate electrode, a gate pad, or the like. FIG. 5 illustrates a portion corresponding to a gate electrode of the gate metal layer 50. The gate electrode may be disposed to overlap the channel region 30b of the semiconductor layer 30.

The gate metal layer 50 may have metal line structure such as any one of the structures shown in FIGS. 1 to 4. For example, the gate metal layer 50 may include a conductive layer 51 and a capping layer 52 disposed on the conductive layer 51. The capping layer 52 may include a first capping layer 52a and a second capping layer 52b disposed on the first capping layer 52a.

The second insulation layer 60 may be disposed on the gate metal layer 50. The second insulation layer 60 may contain silicon nitride, silicon oxide, silicon oxynitride, or the like, and may be formed as a single layer or a multilayer. The second insulation layer 60 may electrically isolate the gate metal layer 50 from the data metal layer 80 disposed thereover.

The planarization layer 70 may be disposed on the second insulation layer 60. The planarization layer 70 may serve as an insulation film, and may also provide surface planarization.

The data metal layer 80 may be disposed on the planarization layer 70. The data metal layer 80 may include a data line, a data pad, and source/drain electrodes. FIG. 5 illustrates a portion corresponding to source/drain electrodes of the data metal layer 80. The source/drain electrodes may be disposed to overlap the source region 30a and drain region 30c of the semiconductor layer 30, respectively.

Contact holes h for electrically connecting the source/drain electrodes of the data metal layer 80 with the source region 30a and drain region 30c of the semiconductor layer 30, respectively, may be formed in the second insulation layer 60 and the third insulation layer 70.

The semiconductor layer 30, the gate metal layer 50, and the data metal layer 80 may constitute a thin film transistor Tr. For example, the gate electrode of the gate metal layer 50 may be a control terminal of the thin film transistor Tr, and the source/drain electrodes of the data metal layer 80 may be an input terminal of the thin film transistor Tr.

The data metal layer 80, similarly to the gate metal layer 50, may have any one of the structures shown in FIGS. 1 to 4. For example, the data metal layer 80 may include a conductive layer 81 and a capping layer 82 disposed on the conductive layer 81. The capping layer 82 may include a first capping layer 82a and a second capping layer 82b disposed on the first capping layer 82a.

Although it is shown in FIG. 5 that both the gate metal layer 50 and the data metal layer 80 have the metal line 200 structure according to an embodiment, in some implementations, only the gate metal layer 50 may have the aforementioned metal line 200 structure, or only the data metal layer 80 may have the aforementioned metal line 200 structure. For example, the gate metal layer 50 and the data metal layer 80 may be formed to have independent structures of each other.

The thin film transistor substrate 1 may be an element included in a display device. For example, a display element such as an organic light-emitting element including an organic light-emitting layer or a liquid crystal display element including a liquid crystal layer may be disposed on the thin film transistor substrate 1.

When the gate metal layer 50 and/or data metal layer 80 included in the thin film transistor substrate 1 have the aforementioned metal line 200 structures, the gate metal layer 50 and/or data metal layer 80 may stably exhibit low resistance characteristics. The thin film transistor substrate 1 can be appropriately applied to a display device realizing high resolution.

FIGS. 6 to 9 illustrate sectional views of stages of a method of manufacturing the metal line 200 shown in FIG. 1 according to process stages.

Figure 6:
FIGS. 6 to 11 illustrate sectional views of stages of a method of manufacturing the metal line shown in FIGS. 1 and 3 according to process steps.

Referring to FIG. 6, an aluminum film or aluminum alloy film 1 may be formed on a base member 100 by a suitable method.

Figure 7:
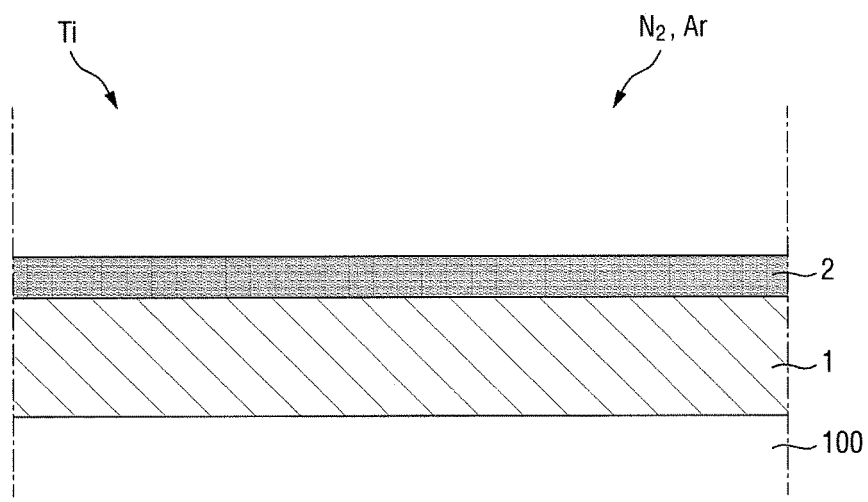

Referring to FIG. 7, a titanium nitride film 2 may be formed on the aluminum film or aluminum alloy film 1. The titanium nitride film 2 may be formed by sputtering.

For example, the titanium nitride film 2 may be formed by supplying titanium, nitrogen, and inert gas into a sputtering chamber in which the aluminum film or aluminum alloy film 1 is placed and applying a voltage. The titanium nitride film 2 may be formed under a nitrogen-rich condition by supplying nitrogen in a larger amount than inert gas. Thus, the atomic ratio of nitrogen to titanium in the titanium nitride film 2 (the number of nitrogen atoms/the number of titanium atoms) may be adjusted to a level of 0.9 to 1.2. The inert gas may be argon (Ar), helium (He), or the like.

Figure 8:
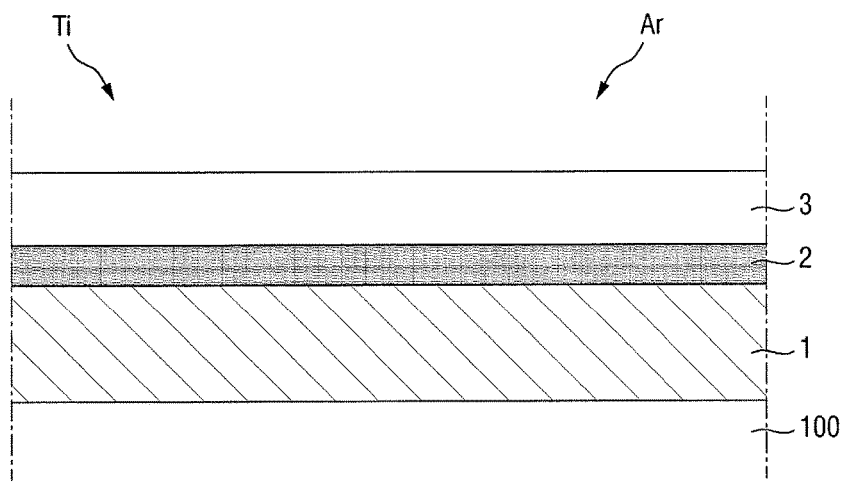

Referring to FIG. 8, a titanium film 3 may be formed on the titanium nitride film 2. The titanium film 3 may be formed by sputtering. For example, the titanium film may be formed by continuous sputtering.

When the supply of nitrogen is stopped while forming the titanium nitride film 2 through sputtering with the supply of titanium and nitrogen, the titanium film 3 may be continuously formed on the titanium nitride film 2 in the same sputtering chamber (continuous sputtering). When the supply of nitrogen is gradually reduced, a capping layer 22 structure having a continuous nitrogen distribution, as shown in FIG. 2, may also be formed.

Figure 9:
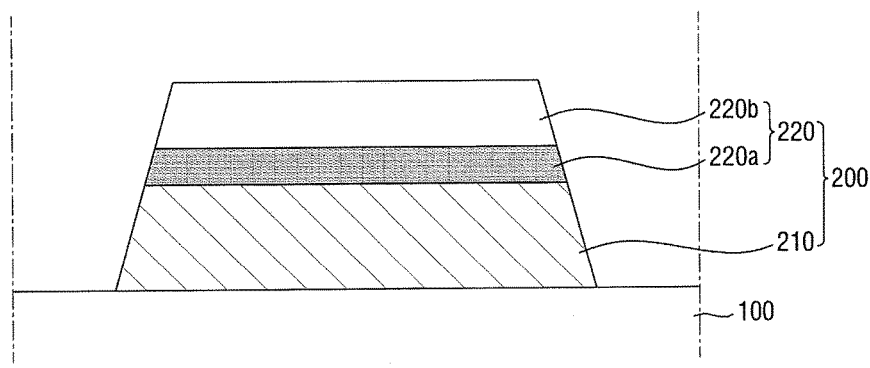

Referring to FIG. 9, the aluminum film (or aluminum alloy film) 1, the titanium nitride film 2, and the titanium film 3 are simultaneously etched, so as to manufacture the metal line 200 of FIG. 1 having a predetermined pattern aluminum film pattern (or aluminum alloy film) pattern 210, titanium nitride film patter 220a, and titanium film pattern 220b.

FIGS. 6 to 8, 10, and 11 are sectional views of a method of manufacturing the metal line 202 shown in FIG. 3 according to process stages.

Referring to FIGS. 6 to 8, the titanium nitride film 2 and the titanium film 3 may be formed on the aluminum film or aluminum alloy film 1 by continuous sputtering. Since this process has been described above, a detailed description thereof will not be repeated.

Figure 10:
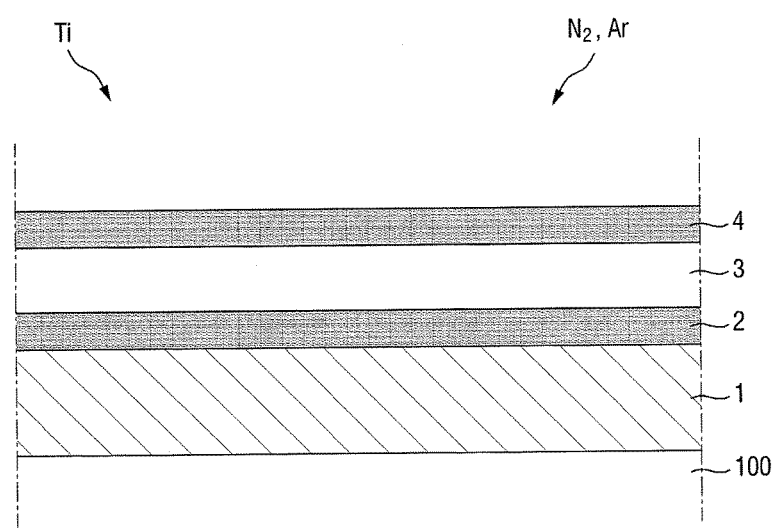

Referring to FIG. 10, a sub-titanium nitride film 4 is formed on the titanium film 3. The sub-titanium nitride film 4 may be formed by sputtering. For example, the sub-titanium nitride film 4 may be formed by continuous sputtering.

For example, when nitrogen is additionally supplied while forming the titanium film 3 through sputtering with the supply of titanium and inert gas, the sub-titanium nitride film 4 may be continuously formed on the titanium film 3 in the same sputtering chamber (continuous sputtering). Further, when the supply of nitrogen is gradually reduced and then gradually increased, a capping layer 223 structure having a continuous nitrogen distribution, as shown in FIG. 4, may be formed.

Figure 11:
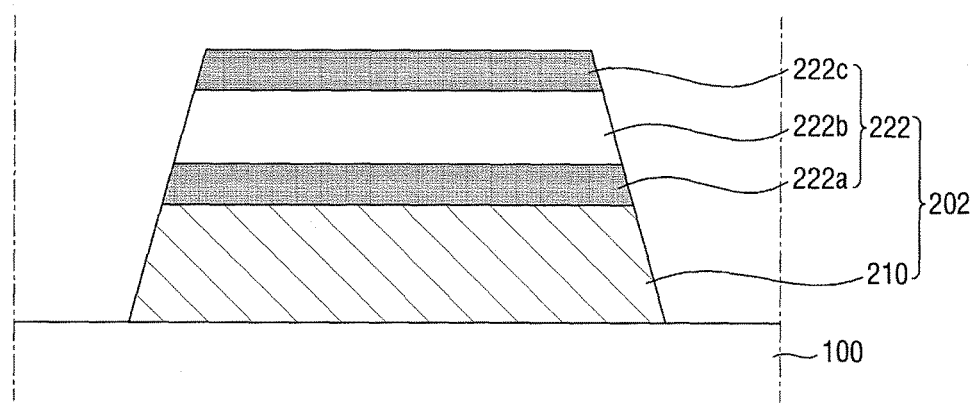

Referring to FIG. 11, the aluminum film (or aluminum alloy film) 1, the titanium nitride film 2, the titanium film 3, and the sub-titanium nitride film 4 may be simultaneously etched, so as to manufacture the metal line 202 of FIG. 3 having a predetermined pattern including an aluminum film pattern (or aluminum alloy film) pattern 210, titanium nitride film patter 222a, titanium film pattern 222b, and sub-titanium nitride film pattern 222c.

By way of summation and review, a thin film transistor may include a metal line such as a gate line or a data line for transmitting electrical signals. Generally, molybdenum (Mo) has been used as a conductive metal constituting such a metal line. However, when the thickness of a molybdenum layer is made thinner in order to reduce the thickness of the thin film transistor, resistance increases. Accordingly, it is disadvantageous to use molybdenum (Mo) in a thin high-resolution display device.

An aluminum (Al)-based metal line may have relatively low resistance as compared to molybdenum. However, an aluminum film may be susceptible to damage during a subsequent process.

According to embodiments, it is possible to stably provide low resistance characteristics in a metal line by forming a capping layer containing titanium nitride ($TiN_x$) and titanium (Ti) on a conductive layer containing aluminum or an aluminum alloy. A thin film transistor may include the metal line.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A metal line, comprising:
a conductive layer containing aluminum (Al) or an aluminum alloy;
a first capping layer on the conductive layer, the first capping layer containing titanium nitride (TiN$_x$); and
a second capping layer on the first capping layer, the second capping layer containing titanium (Ti).

2. The metal line according as claimed in claim 1, wherein:
the conductive layer contains the aluminum alloy, and
the aluminum alloy includes at least one of nickel (Ni), lanthanum (La), neodymium (Nd), and germanium (Ge).

3. The metal line according as claimed in claim 1, wherein an atomic ratio of nitrogen and titanium contained in the first capping layer, the atomic ratio being expressed by the formula: number of nitrogen atoms/number of titanium atoms, is 0.9 to 1.2.

4. The metal line according as claimed in claim 1, wherein the conductive layer and the first capping layer contact each other.

5. The metal line according as claimed in claim 1, wherein the first capping layer and the second capping layer contact each other.

6. The metal line according as claimed in claim 1, wherein a content of nitrogen atoms in a portion of the first capping layer closer to the conductive layer is higher than a content of nitrogen atoms in a portion of the first capping layer closer to the second capping layer.

7. The metal line according to claim 1, further comprising:
a third capping layer on the second capping layer, the third capping layer containing titanium nitride.

8. The metal line according as claimed in claim 7, wherein a content of nitrogen atoms in a portion of the third capping layer closer to the second capping layer is lower than a content of nitrogen atoms in a portion of the third capping layer closer to a side opposite to the second capping layer.

9. The metal line according as claimed in claim 7, wherein a content of nitrogen atoms in the first capping layer is different from a content of nitrogen atoms in the third capping layer.

10. A thin film transistor, comprising:
a gate metal layer and a data metal layer electrically isolated from each other by an insulation film,
wherein the gate metal layer and/or the data metal layer includes:
a conductive layer containing aluminum (Al) or an aluminum alloy;
a first capping layer on the conductive layer, the first capping layer containing titanium nitride (TiN$_x$); and
a second capping layer on the first capping layer, the second capping layer containing titanium (Ti).

11. The thin film transistor as claimed in claim 10, wherein an atomic ratio of nitrogen and titanium contained in the first capping layer, the atomic ratio being expressed by the formula: number of nitrogen atoms/number of titanium atoms, is 0.9 to 1.2.

12. The thin film transistor as claimed in claim 10, wherein the gate metal layer and/or the data metal layer further includes a third capping layer on the second capping layer, the third capping layer containing titanium nitride.

13. The thin film transistor as claimed in claim 12, wherein a content of nitrogen atoms in the first capping layer is different from a content of nitrogen atoms in the third capping layer.

14. A method of manufacturing a metal line, the method comprising:
forming a titanium nitride (TiN$_x$) film on an aluminum (Al) film or an aluminum alloy film; and
forming a titanium (Ti) film on the titanium nitride film.

15. The method as claimed in claim 14, wherein an atomic ratio of nitrogen and titanium contained in the titanium nitride film, the atomic ratio being expressed by the formula: number of nitrogen atoms/number of titanium atoms, is 0.9 to 1.2.

16. The method as claimed in claim 14, wherein the titanium nitride film is formed through sputtering using titanium and nitrogen (N$_2$).

17. The method as claimed in claim 16, wherein the titanium film is formed through continuous sputtering in which only a supply of nitrogen stops while forming the titanium nitride film.

18. The method as claimed in claim 16, wherein inert gas is additionally supplied during the sputtering, and
an amount of supply of nitrogen is larger than an amount of supply of the inert gas during the sputtering.

19. The method as claimed in claim 14, further comprising:
forming a sub-titanium nitride film on the titanium film.

20. The method as claimed in claim 19, wherein the titanium film is formed through sputtering, and
the sub-titanium nitride film is formed through continuous sputtering in which nitrogen is additionally supplied while forming the titanium film.

* * * * *